(12) United States Patent
Peccoux et al.

(10) Patent No.: US 11,112,435 B2
(45) Date of Patent: Sep. 7, 2021

(54) CURRENT TRANSDUCER WITH INTEGRATED PRIMARY CONDUCTOR

(71) Applicant: LEM International SA, Plan-les-Ouates (CH)

(72) Inventors: Jean Marc Peccoux, Cran-Gevrier (FR); David Barbagallo, Meinier (CH); Pascal Morel, Saint Pierre en Faucigny (FR)

(73) Assignee: LEM International SA, Plan-les-Ouates (CH)

( * ) Notice: Subject to any disclaimer, the term of this patent is extended or adjusted under 35 U.S.C. 154(b) by 416 days.

(21) Appl. No.: 15/770,275

(22) PCT Filed: Oct. 14, 2016

(86) PCT No.: PCT/EP2016/074685
§ 371 (c)(1),
(2) Date: Apr. 23, 2018

(87) PCT Pub. No.: WO2017/067849
PCT Pub. Date: Apr. 27, 2017

(65) Prior Publication Data
US 2018/0299493 A1  Oct. 18, 2018

(30) Foreign Application Priority Data
Oct. 23, 2015 (EP) .................... 15191357

(51) Int. Cl.
*G01R 15/20* (2006.01)
*G01R 19/00* (2006.01)
(Continued)

(52) U.S. Cl.
CPC ......... *G01R 15/207* (2013.01); *G01R 15/202* (2013.01); *G01R 19/0092* (2013.01);
(Continued)

(58) Field of Classification Search
CPC ............... G01R 15/207; G01R 15/202; G01R 19/0092; G01R 15/181; G01R 15/18;
(Continued)

(56) References Cited

U.S. PATENT DOCUMENTS

2004/0080308 A1  4/2004  Goto
2004/0196024 A1  10/2004 Stauth
(Continued)

FOREIGN PATENT DOCUMENTS

JP           2014219221        11/2014

OTHER PUBLICATIONS

International Search Report and Written Opinion of the International Searching Authority, dated Jan. 13, 2017, for related International patent application No. PCT/EP2016/074685; 13 pages.

*Primary Examiner* — Tung X Nguyen
*Assistant Examiner* — Robert P Alejnikov, Jr.
(74) *Attorney, Agent, or Firm* — Faegre Drinker Biddle & Reath LLP (57) ABSTRACT

An electrical current transducer including a housing, a magnetic core comprising a central passage and a magnetic circuit gap, a magnetic field detector positioned in the magnetic circuit gap, and a leadframe conductor arrangement comprising a primary conductor for carrying the current to be measured and magnetic field detector conductors for connecting the magnetic field detector to an external circuit.

7 Claims, 5 Drawing Sheets

(51) Int. Cl.
*H01L 43/04* (2006.01)
*H01L 43/06* (2006.01)
*H01L 23/00* (2006.01)

(52) U.S. Cl.
CPC ............ *H01L 43/04* (2013.01); *H01L 43/065* (2013.01); *H01L 24/48* (2013.01); *H01L 2224/48247* (2013.01)

(58) Field of Classification Search
CPC ..... G01R 15/183; G01R 15/186; H01L 43/04; H01L 43/065; H01L 24/48; H01L 2224/48247
USPC ........ 324/126, 127, 117 R, 117 H, 251, 219, 324/262, 263
See application file for complete search history.

(56) References Cited

U.S. PATENT DOCUMENTS

| | | |
|---|---|---|
| 2005/0045359 A1 | 3/2005 | Doogue |
| 2007/0279053 A1* | 12/2007 | Taylor .................. G01R 15/207 324/252 |
| 2010/0301852 A1* | 12/2010 | Teppan .................. G01R 15/18 324/253 |
| 2013/0293226 A1 | 11/2013 | Onuma |
| 2014/0253100 A1* | 9/2014 | Lepine ................. G01R 15/207 324/126 |

* cited by examiner

CURRENT TRANSDUCER WITH INTEGRATED PRIMARY CONDUCTOR

This application claims priority to PCT Application Number PCT/EP2016/074685 filed Oct. 14, 2016, which in turn claims priority from European Patent Application Number 15191357.1 filed Oct. 23, 2015, the subject matter of which are incorporated herein by reference.

The present invention relates to an electric current transducer comprising a magnetic core and a magnetic field detector in an air-gap of the magnetic core, for measuring an electrical current flowing in a primary conductor extending through a central passage of the magnetic core.

Electrical current transducer modules for current sensing applications typically comprise a magnetic core made of a high permeability magnetic material, surrounding a central aperture through which passes a primary conductor carrying the current to be measured. The magnetic core may typically have a generally rectangular or circular shape and be provided with an air-gap in which a magnetic field detector, such as a Hall Effect sensor in the form of an ASIC, is positioned. The magnetic flux generated by the electrical current flowing in the primary conductor is concentrated by the magnetic core and passes through the air-gap. The magnetic field in the air-gap is representative of the primary current.

Electrical current sensors are used in a large variety of applications for monitoring or controlling electrical devices and system and in many applications there is an important advantage in reducing the manufacturing cost of such components and also the costs of implementing and using the components in an electrical circuit.

Certain current transducers are provided without a magnetic core for cost and/or size reasons, however this generally reduces reliability and/or sensitivity and/or accuracy and/or operating range of the transducer compared to one provided with a magnetic core surrounding the primary conductor.

There is often also an important advantage in providing compact components in order to miniaturize and/or reduce the weight of the devices in which the components are mounted. There are many applications in which the current transducer is mounted on a circuit board and needs to respect a pre-defined connection footprint or a surface area limitation that requires a particularly compact arrangement. Depending on the voltage amplitude of the primary conductor, this can lead to difficulties in achieving the required electrical creepage distances between the primary conductor and the electrical conductors of the magnetic field detector circuit.

An object of the invention is to provide an electrical current transducer with integrated primary conductor and magnetic field detector, that is accurate and reliable, yet compact and economical to produce.

For certain applications, it is an object of the invention to provide an electrical current transducer with integrated primary conductor and magnetic field detector for mounting on a circuit board, that is accurate and reliable, yet occupies a small surface area on the circuit board and is economical to produce.

It is advantageous to provide an electrical current transducer that has a high electrical creepage resistance value between the primary conductor and conductors of the magnetic field detector.

It is advantageous to provide an electrical current transducer that has a large operating range.

It is advantageous to provide an electrical current transducer that is robust and stable.

It is advantageous to provide an electrical current transducer that is lightweight.

It is advantageous to provide an electrical current transducer that is easy to implement and economical to use.

Objects of the invention have been achieved by providing a current transducer according to claim 1.

Disclosed herein is an electrical current transducer including a housing, a magnetic core comprising a central passage and a magnetic circuit gap, a magnetic field detector positioned in the magnetic circuit gap, and a leadframe conductor arrangement comprising a primary conductor for carrying the current to be measured and magnetic field detector conductors for connecting the magnetic field detector to an external circuit. The primary conductor comprises a central portion extending through the central passage of the magnetic core, lateral extension arms extending from opposite ends of the central portion, and connection ends for connection to an external conductor. The magnetic field detector conductors comprise a plurality of conductors, each conductor comprising a sensing cell connection pad being substantially aligned with the central portion of the primary conductor and a connection end for connection to the external circuit, the housing comprising a base surrounding portions of the leadframe conductor arrangement and forming a magnetic field sensor receiving cavity, a bottom surface of the magnetic field sensor receiving cavity presenting an essentially planar mounting surface exposing said sensing cell connection pads for electrical connection to the sensing cell, the sensing cell bonded on the mounting surface and overlapping one or more of the magnetic field detector conductors and offset from the primary conductor central portion. The housing base further comprises a primary conductor overmold portion that surrounds the central portion of the primary conductor providing a dielectric insulating layer between the magnetic core and the primary conductor. The housing further comprises a cover mounted over the base and covering the magnetic core and magnetic field sensor receiving cavity.

In an advantageous embodiment, the leadframe conductor arrangement is in sheet metal.

In an advantageous embodiment, the base comprises an outer wall portion that surrounds and forms the magnetic field sensor receiving cavity within which the sensing cell is positioned, further comprising an insulating potting material covering the sensing cell and connection pads.

In an advantageous embodiment, the connection ends of the conductor arrangement are bent out of a major plane in which the primary conductor portion and sensing cell connection pads are arranged configured for connection to conductive contact on an external circuit board.

In an advantageous embodiment, the connection ends of the primary conductor and/or the magnetic field detector conductors have end portions bent inwardly towards the housing.

In an advantageous embodiment, the housing base comprises overmold extensions surrounding a portion of the lateral extension arms of the primary conductor projecting beyond a side wall of the housing base.

In an advantageous embodiment, the housing comprises core guide ribs flanking opposite lateral sides of the magnetic core and providing interengaging elements on the base and cover forming a sinuous electrical creepage path between the primary conductor, magnetic core, and an outside of the housing.

In an advantageous embodiment, the base comprises a core guide rib on either side of the magnetic core that inserts into complementary pairs of core guide ribs having an inner wall portion and an outer wall portion on the cover.

In an advantageous embodiment, the housing cover is provided with upper and lower cover wall portions interconnected by an end wall portion to form a general U-shape such that the cover clips over the magnetic core and over the magnetic field sensor receiving cavity and an opposite side of the housing base.

In an advantageous embodiment, the sensing cell is connected to the sensing cell connection pads of the leadframe conductor arrangement by means of a flip chip connection arrangement or by means of bonding wires.

In an advantageous embodiment, the magnetic field detector is in the form of a semiconductor substrate incorporating a magnetic field sensing cell, for instance a Hall Effect cell.

In an advantageous embodiment, the magnetic core has a general U-shape formed by an end branch and lateral branches extending therefrom to free ends, the magnetic circuit gap being formed between the lateral branches proximate the free ends.

In an advantageous embodiment, the free end of at least one of the lateral branches comprises a chamfer on an outer side.

In an advantageous embodiment, the current transducer is an open-loop current transducer.

Further objects and advantageous features of the invention will be apparent from the claims, from the detailed description, and annexed drawings, in which:

FIG. 1a is a perspective view of an electrical current transducer according to a first embodiment of the invention mounted on a circuit board;

FIG. 1b is a perspective underside view of the electrical current transducer of FIG. 1a;

FIG. 1c is an exploded perspective view of the electrical current transducer of FIG. 1a;

FIG. 1e is a partial cross-sectional perspective underside view of the electrical current transducer of FIG. 1a;

FIG. 1f is a cross-sectional view through a leadframe plane of the electrical current transducer of FIG. 1a;

FIG. 2 is a perspective view of a base portion of the electrical current transducer of FIG. 1a;

FIGS. 3a and 3b are perspective views of a cover portion of the electrical current transducer of FIG. 1a;

FIG. 4a is a perspective view of an electrical current transducer according to a second embodiment of the invention mounted on a circuit board;

FIG. 4b is an exploded perspective view of the electrical current transducer of FIG. 4a;

FIG. 4c is a cross-sectional view through a leadframe plane of the electrical current transducer of FIG. 4a;

FIG. 5 is a perspective view of a base portion of the electrical current transducer of FIG. 4a;

FIG. 6 is a perspective view of a cover portion of the electrical current transducer of FIG. 4a;

FIG. 7a is a perspective view of an electrical current transducer according to a second embodiment of the invention mounted on a circuit board prior to a bending operation of the conductors;

FIG. 7b is an exploded perspective view of the electrical current transducer of FIG. 7a;

Referring to the figures, an electrical current transducer according to various embodiments of the invention is shown, the current transducer comprising a housing 10, a magnetic core 6 comprising a central passage 18 and a magnetic circuit gap 22, a magnetic field detector 8 positioned in the magnetic circuit gap 22, and a conductor arrangement 4 made from a leadframe. The leadframe conductor arrangement 4 comprises a primary conductor 14 for carrying the current to be measured, and conductors 16 for connecting to the magnetic field detector 8. The current transducer of the present invention is particularly well suited for open loop current measurement.

The primary conductor 14 comprises a central portion 15, lateral extension arms 13 extending from opposite ends of the central portion 15 and connection ends 17 at the free ends of the extension arms for connection to an external conductor through which flows the current to be measured. The external conductor may in particular be connected to a circuit board 12 provided with conductive contacts 42 for connection to the connection ends 17. The conductive contacts may for instance be in the form of conductive contact pads 42 for surface mount connection of the connection ends 17. The central portion 15 of the primary conductor 14 extends through the central passage 18 of the magnetic core.

The magnetic core has a general U-shape formed by an end branch 6a and lateral branches 6b, 6c extending therefrom to free ends 24, the magnetic circuit gap 22 being formed between the lateral branches 6b, 6c proximate the free ends 24.

The magnetic core 6 acts as a magnetic flux concentrator for the magnetic field detector 8 positioned in the magnetic circuit gap 22. The magnetic flux generated by the current flowing in the primary conductor is concentrated through the magnetic circuit gap 22. The magnetic core is made of a material with a high magnetic permeability, examples of such magnetic materials being FeNi, MnZn, FeSi, nanocrystalline materials, and amorphous materials. The magnetic core according to embodiments of the invention increases the signal level and provides good immunity against the external fields in comparison to current transducers that are not provided with a magnetic core, for instance in which the magnetic field detector is positioned proximate the primary conductor without a magnetic flux concentrator.

In an advantageous embodiment, the free end 24 of the lateral branches is provided with a chamfer 25 on an outer side of the lateral branches, the chamfer increasing the flux flowing with the magnetic field detector by reducing fringe fields.

The leadframe conductor arrangement 4 is stamped and formed out of a single piece of sheet metal, whereby the central portion 15 of the primary conductor and the major portions of the magnetic field detector conductors 16 substantially aligned and extend in a same major plane and comprise substantially identical thicknesses corresponding to the sheet metal thickness from which the conductor arrangement is formed. The connection ends 17 of the primary conductor 14 and connection ends 19 of the magnetic field detector conductors 16 may be bent out of the major plane to provide terminals for connection to an external circuit, in particular for connection to the contact pads 42 of the external circuit board 12.

The magnetic field detector conductors 16 comprise a plurality of conductors, each conductor comprising a connection end 19 for connection to the external circuit and a sensing cell connection pad 21 in the leadframe major plane for connection to the magnetic field detector 8. The magnetic field detector conductors comprise at least a pair of supply terminals 16b, 16c, for instance one being at a supply voltage Vc and the other at ground GND, and at least one signal out terminal Vout 16d. The magnetic field detector conductors may further comprise a reference terminal Vref 16e, a ground terminal 16a and optionally supplementary signal out terminals, for instance for an overcurrent detection signal OCD 16f.

The connection pads 21 may be provided with different shapes, surface areas and positions optimized for connection to the sensing cell 26. In the illustrated embodiments, the connection pads 21 are connected to the magnetic field detector by means of bond wire connections 27. The magnetic field detector 8 comprises a sensing cell 26 and connection means 27, for instance in the form of bond wires 27. Other interconnection means that are per se known in the art can however be provided between the sensing cell 26 and connection pads 21 of the leadframe conductor arrangement 4. For instance, the interconnection means may comprise a so called "flip chip" connection arrangement between a semiconductor substrate and metal contact pads, whereby solder beads interconnect connection areas on the sensing cell 26 to the connection pads 21 of the leadframe conductor arrangement 4.

The sensing cell 26 may, in a preferred embodiment, be in the form of a Hall sensor, per se well-known in the art of current transducers, that is formed in a semiconductor substrate (for instance a silicon substrate). Other sensing cell technologies may however also be adopted in the present invention, for instance fluxgate type of magnetic field detectors or giant magneto resistive type of magnetic field sensors. Hall sensors that are formed in a substantially planar semiconductor substrate are advantageous in view of their low cost, compactness, and robustness.

The magnetic field detector conductors 16 and primary conductor central portion 15 are advantageously in the same plane (the major plane), or essentially the same plane, and are held together by a base 20 of the housing 10. The base 20 of the housing 10 is overmolded over portions of the leadframe conductor arrangement 4 while exposing contact pad portions of the magnetic field detector conductors. The base and leadframe conductor arrangement present an essentially planar mounting surface with the connection pads 21 of the magnetic field detector conductors 16 accessible from a magnetic field sensor receiving cavity 36 of the base 20, for positioning and fixing the sensing cell on the mounting surface, for instance by means of adhesive bonding.

The base 20 comprises an outer wall portion 38 that surrounds and forms a magnetic field sensor receiving cavity 36 within which the sensing cell 26 and bond wires may be positioned against the major plane of the leadframe conductor arrangement 4. The receiving cavity 36 may also hold an insulating potting material 28 that provides insulation around the sensing cell 26, connection means 27 and connection pads 21. The potting material may be filled in the receiving cavity after connection of the bond wires or of other connection means between the sensing cell and connection pads 21.

The base 20 of the housing advantageously comprises a primary conductor overmold portion 30 that is overmolded around the central portion 15 of the primary conductor 14. The overmold portion 30 provides a dielectric insulating layer between the magnetic core and the primary conductor as well as providing a positioning guide between the central passage of the magnetic core and the primary conductor, also ensuring proper positioning of the sensing cell 26 within the magnetic circuit gap 22.

The magnetic core 6 and leadframe conductor arrangement 4 with the overmolded housing base 20 of the present invention provides a particularly compact arrangement yet allowing the primary conductor to be well separated and insulated from the magnetic field detector conductors 16. The primary conductor central portion 15 can be provided with a large and unreduced cross section and at the same time have a good insulation separation distance from the sensing cell of the magnetic field detector in a compact footprint (i.e. surface area occupied by the electrical current transducer when positioned on an external circuit board).

The housing 10 may further comprise core guide ribs 32, 33 flanking opposite lateral sides of the magnetic core 6. The core guide ribs may function to laterally position the magnetic core in the housing and advantageously may have interengaging elements on the base 20 and cover 34 in order to create a long creepage distance between the primary conductor 14, magnetic core 6, and the outside of the housing 10. In an illustrated embodiment, the base 20 comprises a core guide rib 32 on either side of the magnetic core 6 that insert into complementary pairs of core guide ribs 33 having an inner wall portion 33a and an outer wall portion 33b on the cover 34.

The interengaging ribs extend the length of the path defined by the interface of the cover and base, between the inside and outside of the housing. This provides a long electrical creepage distance between the inside and outside of the housing.

In the embodiment illustrated in FIGS. 1a to 1f, the cover 34 is provided with upper and lower cover wall portions 44a, 44b interconnected by an end wall portion 44c to form a general U-shape such that the cover clips over the magnetic core 6 and over the magnetic field sensor receiving cavity 36 and an opposite side of the base 20.

Figures 1A, 1B, 1C:
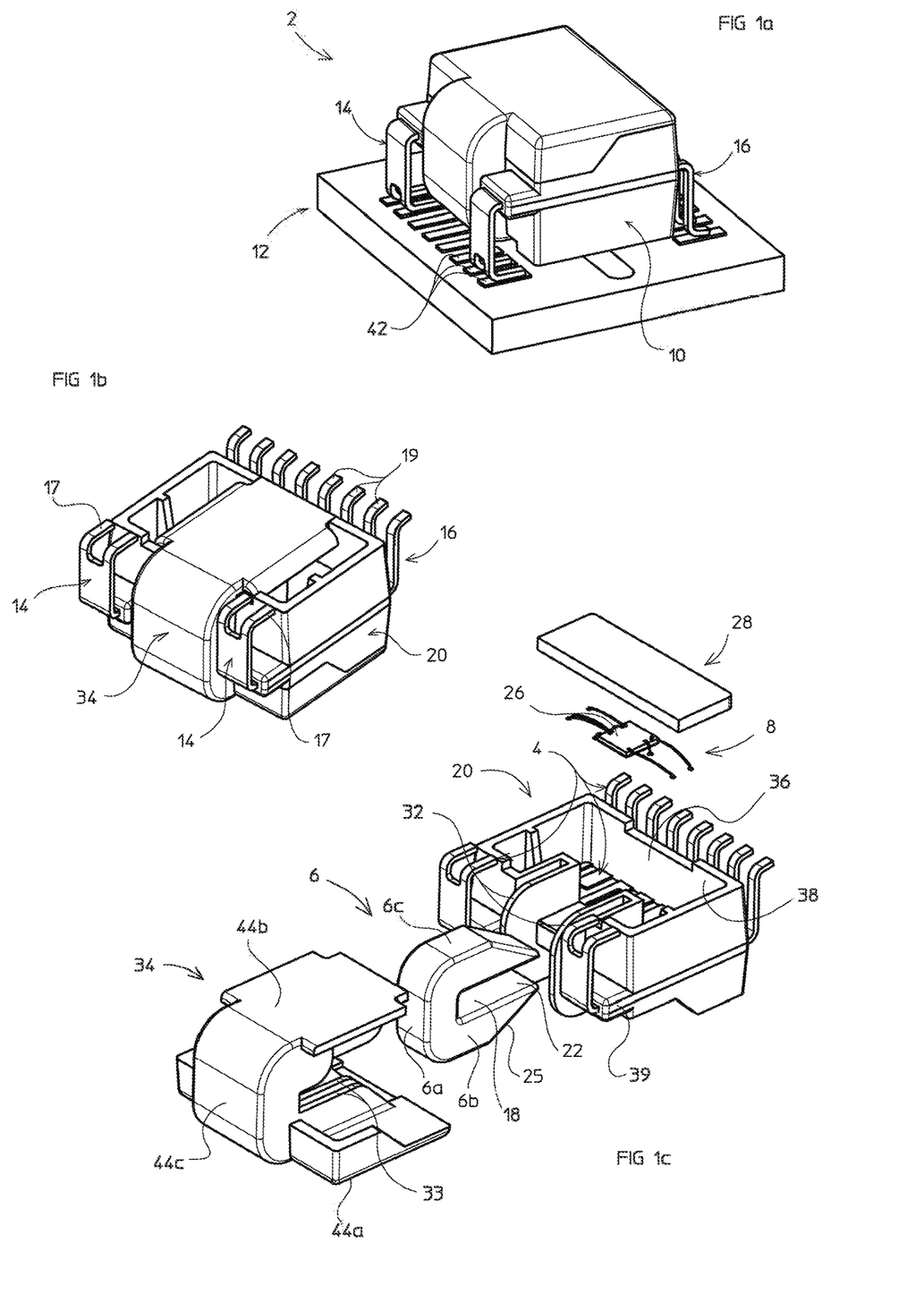
Figure 1D:
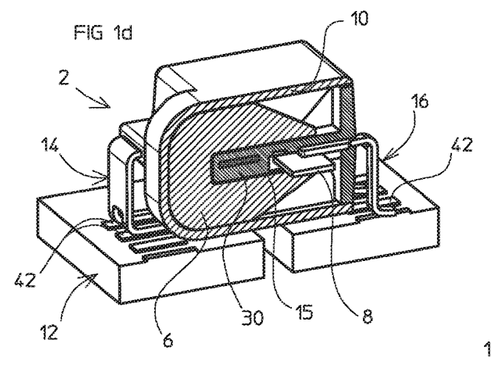
FIG. 1d is a cross-sectional perspective view of the electrical current transducer of FIG. 1a on a circuit board.
Figure 1E:
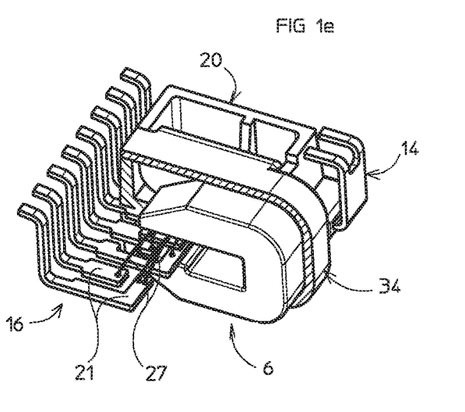
Figure 1F:
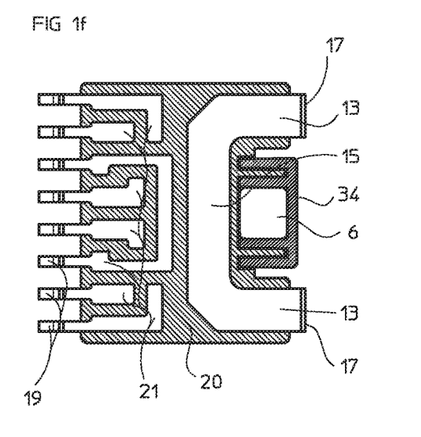
Figure 2:
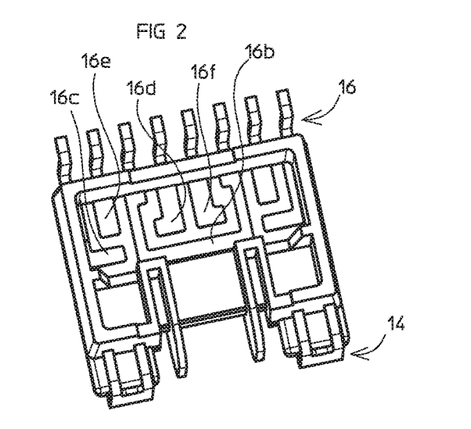
Figure 3A:
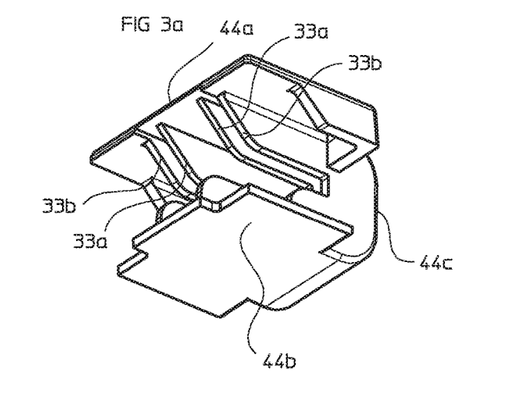
Figure 3B:
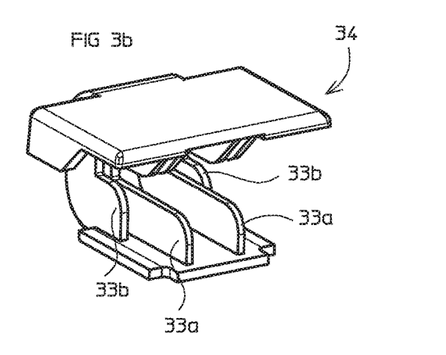
Figures 4A, 4B, 4C:
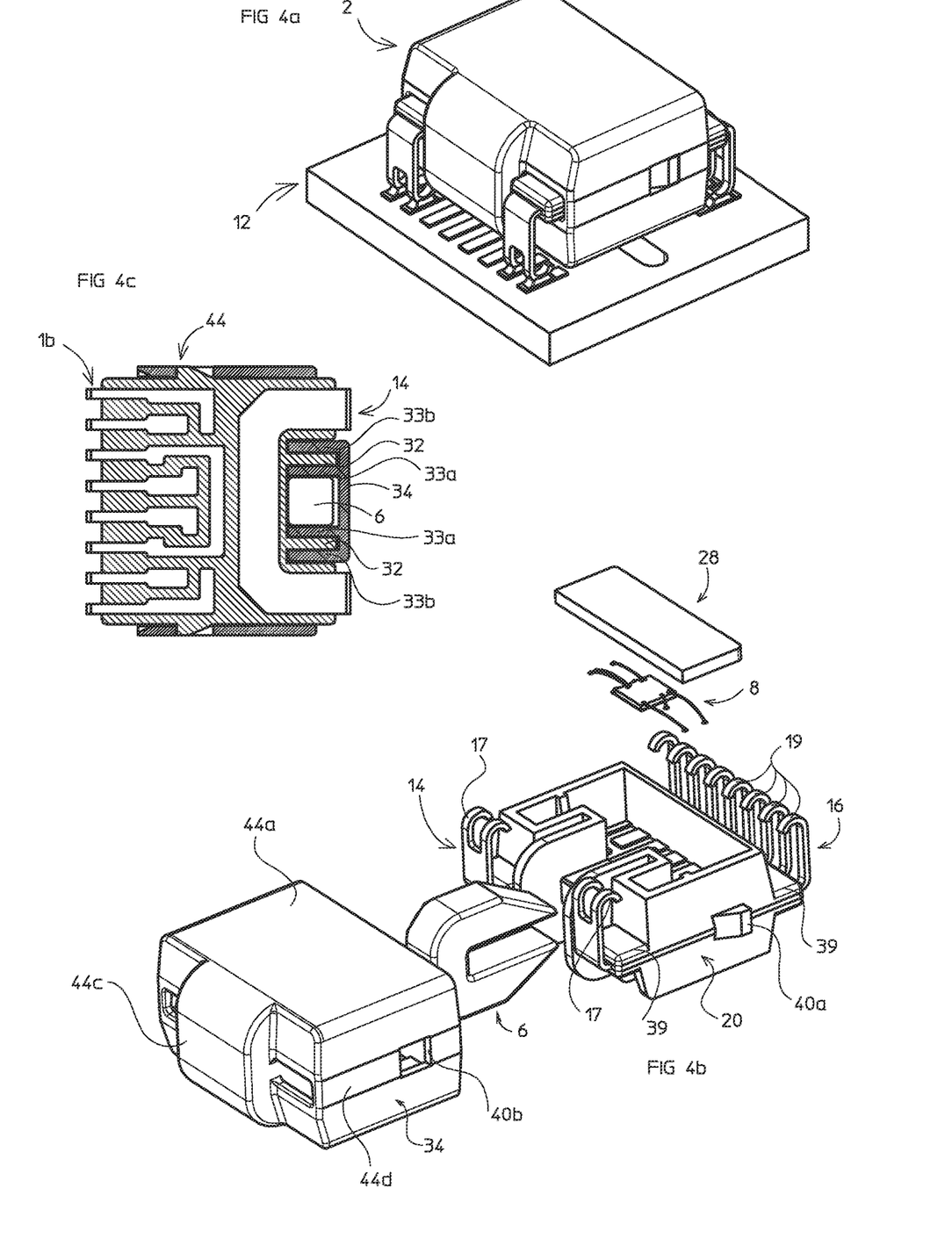
Figure 5:
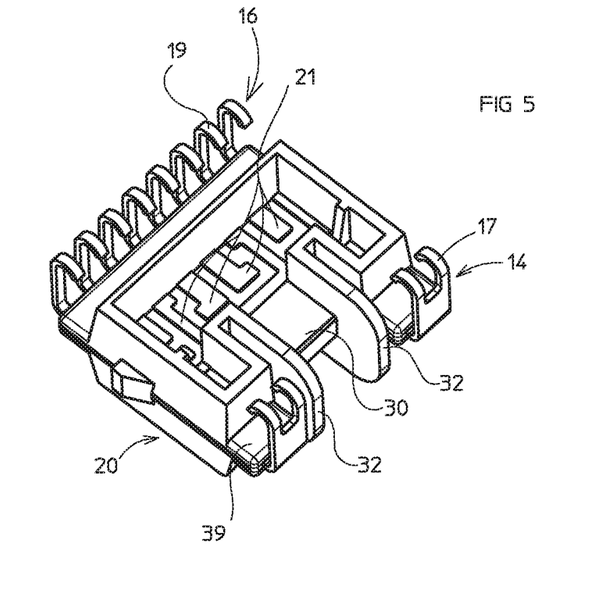
Figure 6:
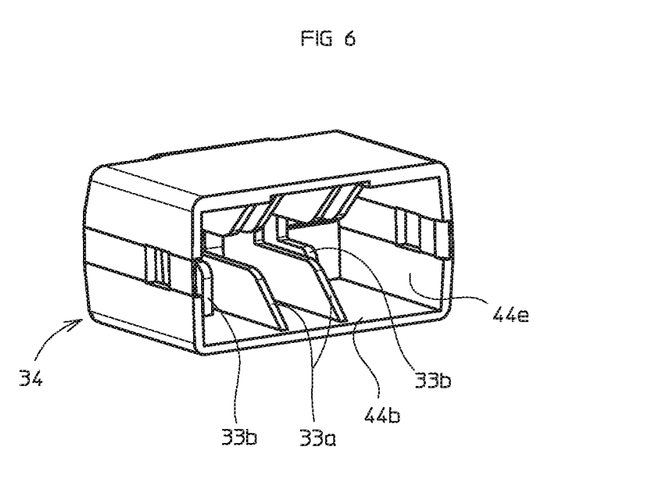

In an advantageous embodiment, the primary conductor 14 connection ends 17 are inwardly bent towards the housing 10. In comparison to outwardly bent connection ends, this allows to increase the length of the lateral extension arms 13 projecting out of the housing, for a given contact pad footprint on the circuit board 12. The extension arms of the primary conductor allow the housing to be provided with overmold extensions 39 that increase the electrical creepage distance between the primary conductors and the magnetic field detector conductors 16 along the outside of the housing. The magnetic field detector conductors 16 may also comprise inwardly bent connection ends 19 as shown in the embodiments of FIGS. 4a to 5.

Figures 7A, 7B:
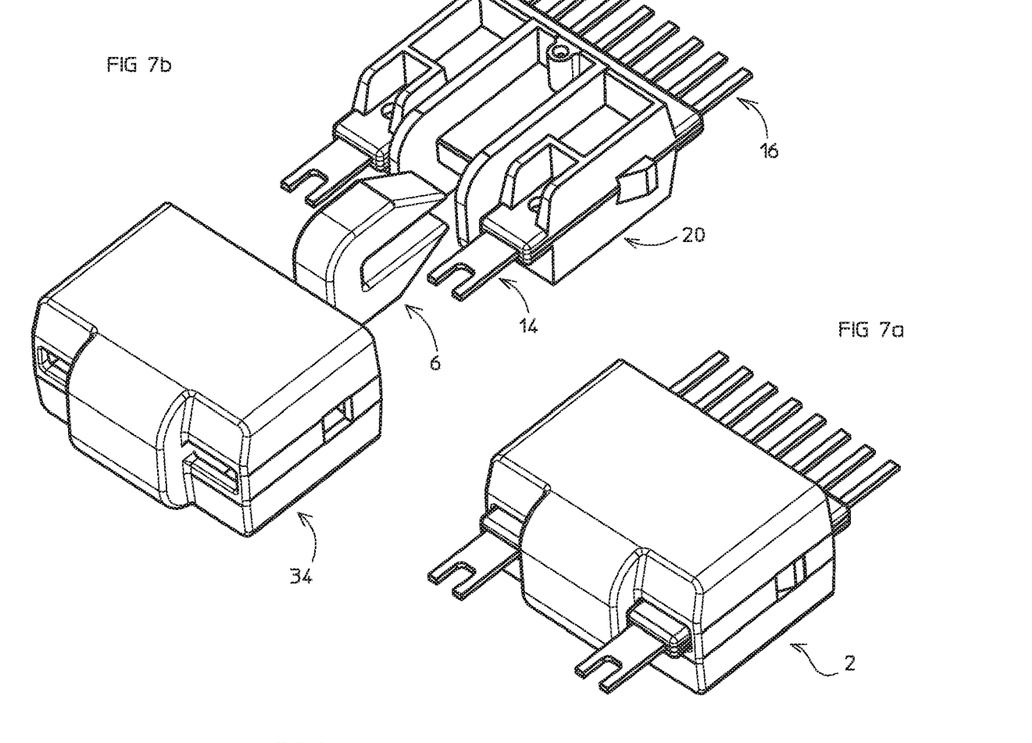

In another embodiment, the cover 34 may be provided as a shroud with upper 44a, lower 44b, end 44c and opposite side wall 44d, 44e portions within which the base 20 of the housing is essentially fully inserted. FIGS. 7a and 7b illustrate the assembly of the cover 34 over the housing base 20, whereby the connection ends 17, 19 of the conductors are bent after closing of the cover on the housing base. The housing cover and base may be provided with complementary latching elements 40, for instance in the form of a latching protrusion 40a and latching shoulder 40b on the housing respectively the base such that the cover and base may be securely locked together during assembly.

Figure 8:
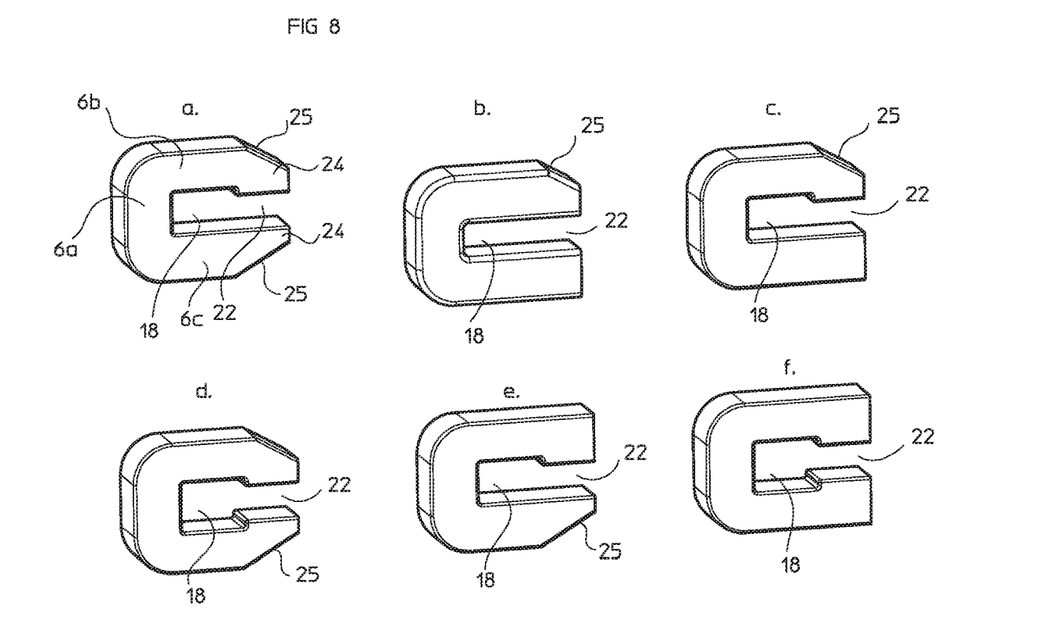
FIGS. 8a to 8f are perspective views of different variants of a magnetic core of an electrical current transducer according to embodiments of the invention.

Referring to FIG. 8, variants of the magnetic core are illustrated showing different shapes, with chamfer 25 or without, of the free ends 24 of the lateral branches 6b, 6c of the magnetic core.

LIST OF REFERENCES USED electric current transducer 2
    leadframe conductor arrangement 4
        primary conductor 14
            lateral extension arms 13
            central portion 15
            (circuit board) connection ends 17
        magnetic field detector conductors 16
            ground terminal 16a
            supply terminals (Vc, GND) 16b, 16c
            signal out terminal (Vout) 16d
            reference terminal (Vref) 16e subsidiary signals e.g overcurrent detection signal (OCD) 16f
(circuit board) connection ends 19
sensing cell connection pads 21
magnetic core 6
  central passage 18
  magnetic circuit gap 22
  end branch 6a
  lateral branches 6b, 6c
    free end 24
magnetic field detector 8
  sensing cell 26
  connections (bond wires) 27
  potting 28
housing 10
  base 20
    primary conductor overmold portion 30
    core guide ribs 32
    magnetic field sensor receiving cavity 36
      outer rim portions 38
      overmold extensions 39
  cover 34
    latching elements (protrusions) 40
    core guide ribs 33, inner 33a, outer 33b
    cover wall portions 44a, 44b, 44c, 44d, 44e
external circuit board 12
  contact pads 42

The invention claimed is:

1. An electrical current transducer including a housing, a magnetic core comprising a central passage and a magnetic circuit gap, a magnetic field detector comprising a sensing cell positioned in the magnetic circuit gap, and a sheet metal leadframe conductor arrangement comprising a primary conductor for carrying the current to be measured and magnetic field detector conductors for connecting the magnetic field detector to an external circuit, the primary conductor comprising a central portion extending through the central passage of the magnetic core, lateral extension arms extending from opposite ends of the central portion, and connection ends for connection to an external conductor, the magnetic field detector conductors comprising a plurality of conductors, each conductor comprising a sensing cell connection pad substantially aligned with the central portion of the primary conductor and a connection end for connection to the external circuit, the housing comprising a base surrounding portions of the leadframe conductor arrangement and forming a magnetic field sensor receiving cavity, a bottom surface of the magnetic field sensor receiving cavity presenting an essentially planar mounting surface exposing said sensing cell connection pads for electrical connection to the sensing cell, the sensing cell bonded on the mounting surface and overlapping one or more of the magnetic field detector conductors and offset from the primary conductor central portion, the housing base further comprising a primary conductor overmold portion that surrounds the central portion of the primary conductor providing a dielectric insulating layer between the magnetic core and the primary conductor, the housing further comprising a cover mounted over the base and covering the magnetic core and magnetic field sensor receiving cavity, wherein the housing comprises core guide ribs flanking opposite lateral sides of the magnetic core and providing interengaging elements on the base and cover forming a sinuous electrical creepage path between the primary conductor, magnetic core, and magnetic field detector conductors and the base comprises a core guide rib on either side of the magnetic core that inserts into complementary pairs of core guide ribs having an inner wall portion and an outer wall portion on the cover.

2. The current transducer according to claim 1, wherein the housing cover is provided with upper and lower cover wall portions interconnected by an end wall portion to form a general U-shape such that the cover clips over the magnetic core and over the magnetic field sensor receiving cavity and an opposite side of the housing base.

3. The current transducer according to claim 1, wherein the sensing cell is connected to the sensing cell connection pads of the leadframe conductor arrangement by means of a flip chip connection arrangement or by means of bonding wires.

4. The current transducer according to claim 3, wherein the magnetic field detector is in the form of a semiconductor substrate incorporating a magnetic field sensing cell, for instance a Hall Effect cell.

5. The current transducer according to claim 1, wherein the magnetic core has a general U-shape formed by an end branch and lateral branches extending therefrom to free ends, the magnetic circuit gap being formed between the lateral branches proximate the free ends.

6. The current transducer according to claim 5, wherein the free end of at least one of the lateral branches comprises a chamfer on an outer side.

7. The current transducer according to claim 1, wherein the current transducer is an open-loop current transducer.

* * * * *